(12) United States Patent
Shimada

(10) Patent No.: US 11,765,890 B2
(45) Date of Patent: Sep. 19, 2023

(54) SEMICONDUCTOR MEMORY DEVICE AND METHOD OF FORMING THE SAME

(71) Applicant: MICRON TECHNOLOGY, INC., Boise, ID (US)

(72) Inventor: Keisuke Shimada, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 73 days.

(21) Appl. No.: 17/398,806

(22) Filed: Aug. 10, 2021

(65) Prior Publication Data
US 2023/0047552 A1    Feb. 16, 2023

(51) Int. Cl.
*H10B 12/00* (2023.01)
*H01L 21/768* (2006.01)
*G11C 11/402* (2006.01)
*G11C 5/06* (2006.01)

(52) U.S. Cl.
CPC ............ *H10B 12/488* (2023.02); *G11C 5/06* (2013.01); *G11C 11/4023* (2013.01); *H01L 21/76877* (2013.01); *H10B 12/30* (2023.02)

(58) Field of Classification Search
None
See application file for complete search history.

(56) References Cited

U.S. PATENT DOCUMENTS

2012/0299063 A1* 11/2012 Baba ............ H01L 45/06
257/E21.004

* cited by examiner

*Primary Examiner* — Mohammad M Hoque
*Assistant Examiner* — Kevin Quinto
(74) *Attorney, Agent, or Firm* — Dorsey & Whitney LLP

(57) ABSTRACT

A method includes forming a plurality of first line-shaped mask patterns over a substrate including a memory cell region and an array edge region; forming a plurality of second line-shaped mask patterns over the plurality of first line-shaped mask patterns; removing first portions from the plurality of first line-shaped mask patterns in the memory cell region to leave a plurality of island-shaped mask patterns above the memory cell region; removing second portions from the plurality of first line-shaped mask patterns in the array edge region to leave a holes-provided mask pattern above the array edge region; forming a mask pattern which includes a plurality of holes provided on portions; and forming, with the mask pattern which includes the plurality of holes, a plurality of contact holes in the array edge region to provide a plurality of contact electrodes connected to a plurality of word-lines.

11 Claims, 18 Drawing Sheets ofor # SEMICONDUCTOR MEMORY DEVICE AND METHOD OF FORMING THE SAME

BACKGROUND

In recent years, in semiconductor memory devices such as dynamic random access memory (hereinafter referred to as DRAM) for example, further miniaturization has been being pursued in order to increase the data storage capacity. DRAM word-lines extend across a memory cell region and an array edge region adjacent to the memory cell region. Word-line contacts are placed on the word-lines in the array edge region.

BRIEF DESCRIPTION OF THE DRAWINGS

FIG. 4B is a diagram illustrating a schematic configuration of a portion along the E-E line of FIG. 4A;

FIG. 5B is a diagram illustrating a schematic configuration of a portion along the E-E line of FIG. 5A;

FIG. 6B is a diagram illustrating a schematic configuration of a portion along the E-E line of FIG. 6A;

FIG. 7B is a diagram illustrating a schematic configuration of a portion along the E-E line of FIG. 7A;

FIG. 8B is a diagram illustrating a schematic configuration of a portion along the E-E line of FIG. 8A;

FIG. 9B is a diagram illustrating a schematic configuration of a portion along the E-E line of FIG. 9A;

FIG. 10B is a diagram illustrating a schematic configuration of a portion along the E-E line of FIG. 10A;

FIG. 11B is a diagram illustrating a schematic configuration of a portion along the E-E line of FIG. 11A;

FIG. 12B is a diagram illustrating a schematic configuration of a portion along the E-E line of FIG. 12A;

FIG. 13B is a diagram illustrating a schematic configuration of a portion along the E-E line of FIG. 13A;

FIG. 14B is a diagram illustrating a schematic configuration of a portion along the E-E line of FIG. 14A;

FIG. 15B is a diagram illustrating a schematic configuration of a portion along the E-E line of FIG. 15A;

DETAILED DESCRIPTION

Figure 1:
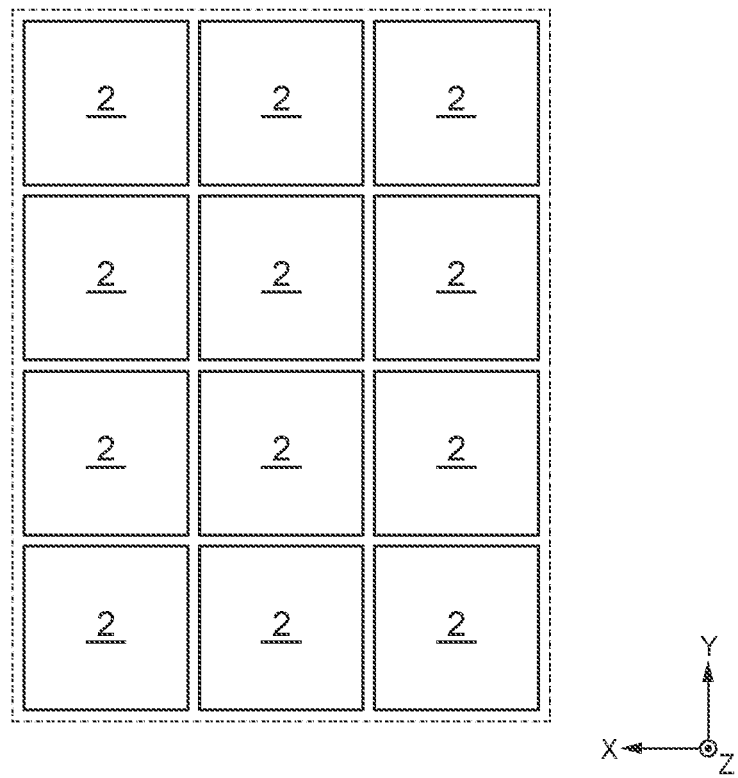
FIG. 1 is a plan view illustrating a schematic configuration of a part of a memory cell region of a semiconductor memory device according to the embodiment.

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Hereinafter, a semiconductor memory device and a method of forming the same according to an embodiment will be described with reference to FIGS. 1 to 21. The semiconductor memory device according to the embodiment will be described by taking DRAM as an example. In the description of the embodiment, common or related elements and elements that are substantially the same are denoted with the same signs, and the description thereof will be omitted. In the drawings referenced hereinafter, the dimensions and dimensional ratios of respective units in each of the drawings do not necessarily match the actual dimensions and dimensional ratios in the embodiment. Further, the sizes, lengths and the number of respective elements illustrated in each of the drawings do not match among the drawings. Also, in the following description, the vertical direction means the vertical direction in the case where a semiconductor substrate 6 is on the bottom.

Figure 2:
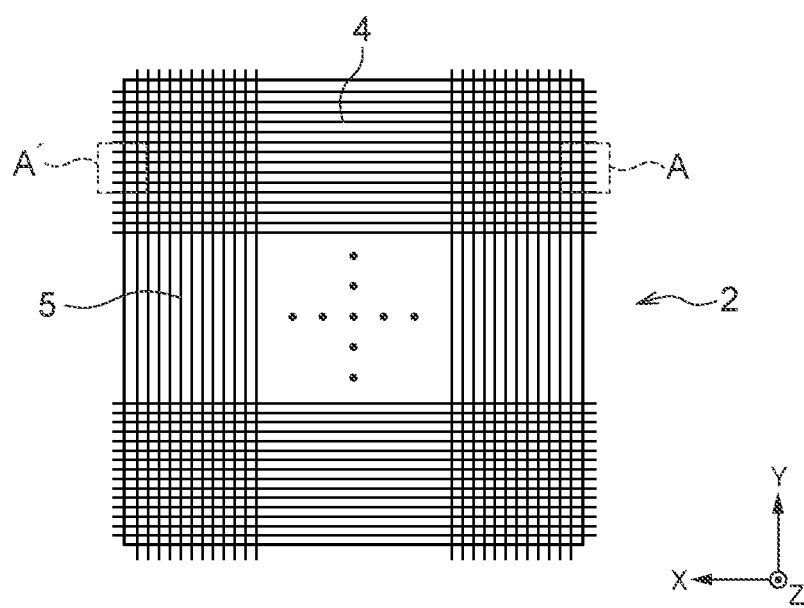
FIG. 2 is a plan view illustrating a schematic configuration of a memory mat of the semiconductor memory device according to the embodiment.

FIGS. 1 and 2 are diagrams illustrating plan-view layouts of the semiconductor memory device according to the embodiment. As illustrated in FIG. 1, the semiconductor memory device is provided with a plurality of memory mats 2 disposed in a matrix on the surface of a semiconductor substrate. As illustrated in FIG. 2, in each of the memory mats 2, a plurality of word-lines 4 are disposed in parallel so as to extend in an X direction of the diagram of FIG. 2. Additionally, a plurality of bit-lines 5 are disposed in the memory mats 2 in parallel so as to extend orthogonally to the word-lines 4, or in other words in a Y direction of the diagram of FIG. 2.

A memory mat end region A is disposed on one peripheral part of the memory mat 2 in the X direction. A memory mat end region A' is disposed on the other peripheral part of the memory mat 2 in the X direction. The configuration of the memory mat end region A' is substantially the same as the configuration of the memory mat end region A. The following description will be made on the memory mat end area A.

In the memory mat end region A, each word-line 4 is connected to a row decoder not illustrated in the peripheral part thereof. The row decoder accepts the input of a row address selected when reading/writing a memory cell from a row address buffer not illustrated. The plurality of word-lines 4 are each paired with a corresponding one of the plurality of memory cells, and control access to corresponding memory cells among the plurality of memory cells.

Each bit-line 5 is connected to a column decoder not illustrated at the peripheral part. The column decoder accepts the input of a column address selected when reading/writing a memory cell from a column address buffer not illustrated. The plurality of bit-lines 5 are each paired with a corresponding one of the plurality of memory cells, and control access to corresponding memory cells among the plurality of memory cells.

Figure 3A:
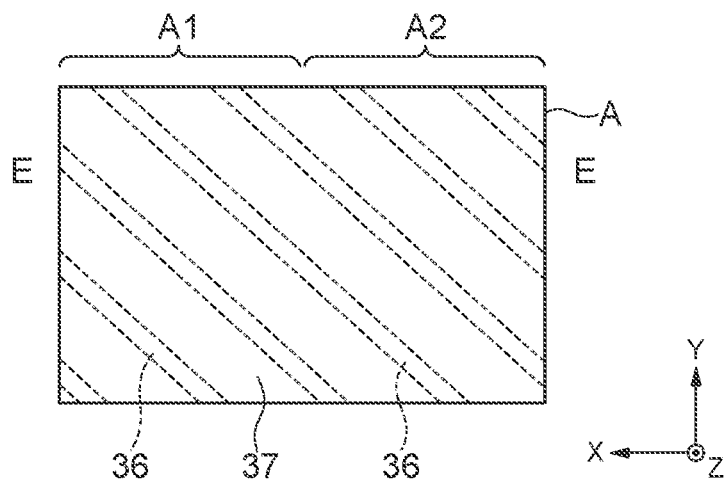
FIG. 3A is a diagram illustrating a method of forming the semiconductor memory device according to the embodiment, is a plan-view layout illustrating a schematic configuration of a memory cell region and an array edge region in an exemplary process stage, and is an enlarged view of a memory mat end region A.
Figure 3B:
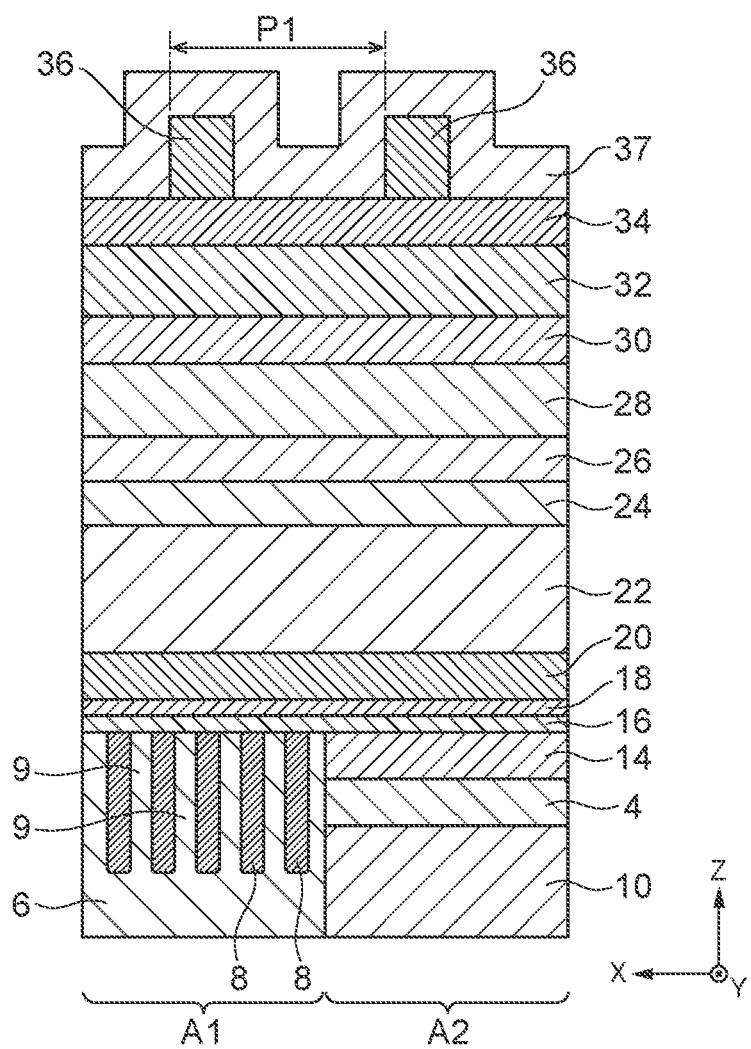
FIG. 3B is a diagram illustrating the method of forming the semiconductor memory device according to the embodiment, is a longitudinal section illustrating a schematic configuration of the memory cell region and the array edge region in an exemplary process stage, and is a diagram illustrating a schematic configuration of a portion along an E-E line of FIG. 3A.

Next, the semiconductor memory device according to the embodiment and the method of forming the same will be described with reference to FIGS. 3A and 3B to FIGS. 15A and 15B, and FIG. 16 to FIG. 21. FIG. 3A is an enlarged plan-view layout of the memory mat end region A of FIG. 2. FIG. 3B is a longitudinal section illustrating a schematic configuration along an E-E line of FIG. 3A.

As illustrated in FIGS. 3A and 3B, in the memory mat end region A, the semiconductor memory device includes a memory cell region A1 and an array edge region A2 adjacent to the memory cell region A1. In the memory cell region A1, the semiconductor substrate 6 is provided with an isolation region 8 and a plurality of active regions 9. The plurality of active regions 9 are each island-shaped and isolated, and defined by the isolation regions 8. For example, a single crystal silicon substrate may be used as the semiconductor substrate 6. The isolation region 8 is formed, for example, by filling an insulating material such as silicon dioxide ($SiO_2$) in a trench formed in the semiconductor substrate 6. The plurality of active regions 9 are arranged at the intersection points between the word-lines 4 and the bit-lines 5 illustrated in FIG. 2.

The word-line 4 is formed so as to extend across the memory cell region A1 and the array edge region A2. The word-line 4 has, for example, a trench gate structure. A section of a portion where no word-line 4 exists is illustrated in the longitudinal section of the memory cell region A1 illustrated in FIG. 3B, and thus no word-line 4 is illustrated in FIG. 3B. A section of a portion where the word-line 4 exists is illustrated in the longitudinal section of the array edge region A2 illustrated in FIG. 3B.

As illustrated in FIG. 3B, in the array edge region A2, the word-line 4 is formed by filling a conductive material in the trench formed in a first insulating film 10. The word-line 4 contains, for example, titanium nitride (TiN) or a lamination film of titanium nitride and polysilicon (poly-Si). The first insulating film 10 contains, for example, silicon dioxide. A second insulating film 14 is filled in the trench and above the word-line 4. The second insulating film 14 contains, for example, silicon nitride (SiN) or silicon dioxide.

Subsequently, a third insulating film 16, a fourth insulating film 18, a fifth insulating film 20, a first sacrificial film 22, a second sacrificial film 24, s third sacrificial film 26, a fourth sacrificial film 28, a fifth sacrificial film 30, a sixth sacrificial film 32, and a seventh sacrificial film 34 are laminated in this order on the semiconductor substrate 6 having the above configuration. Next, patterned resist patterns 36 are formed on the seventh sacrificial film 34. The third insulating film 16, the fifth insulating film 20, and the third sacrificial film 26 contain, for example, silicon dioxide. The fourth insulating film 18 contains, for example, silicon nitride. The first sacrificial film 22 and the sixth sacrificial film 32 contain, for example, carbon. The second sacrificial film 24, the fifth sacrificial film 30, and the seventh sacrificial film 34 contain, for example, silicon oxynitride (SiON). The fourth sacrificial film 28 contains, for example, amorphous silicon (a-Si).

The third insulating film 16, the fourth insulating film 18, the first sacrificial film 22, the second sacrificial film 24, the fifth sacrificial film 30, the sixth sacrificial film 32, and the seventh sacrificial film 34 are formed, for example, by using CVD. The fifth insulating film 20 is formed, for example, by plasma CVD which uses TEOS (tetra ethoxy silane) as a source gas to form a film in a plasma atmosphere. The third sacrificial film 26 is formed, for example, by CVD using silane ($SiH_4$) as a source gas. The fourth sacrificial film 28 is formed, for example, by plasma CVD which forms a film in a plasma atmosphere.

The resist patterns 36 are formed by a publicly-known lithography technique. The resist patterns 36 are formed so as to form a line-and-space pattern inclining from the upper left to the lower right in FIG. 3A. The resist patterns 36 are arranged in parallel so as to form a plurality of line-shaped periodic patterns having a pitch P1.

Subsequently, a sacrificial film 37 is formed on the seventh sacrificial film 34 and the resist patterns 36. The sacrificial film 37 contains an insulating material, for example, contains silicon dioxide. The sacrificial film 37 is formed, for example, by using a plasma ALD (atomic layer deposition) technique or a low temperature plasma ALD technique. The sacrificial film 37 is formed so as to follow the shapes of the resist patterns 36. The film thickness of the sacrificial film 37 is adjusted so as to be the same as the dimension in the X direction of a side wall portion 37a described later in FIG. 4B.

Subsequently, as described below, pitch doubling processing is performed to form patterns having a pitch P2 which is half the pitch P1 with formation of the resist patterns 36 having the pitch P1 as a starting point. The pitch doubling processing has the following steps.

Figure 4A:
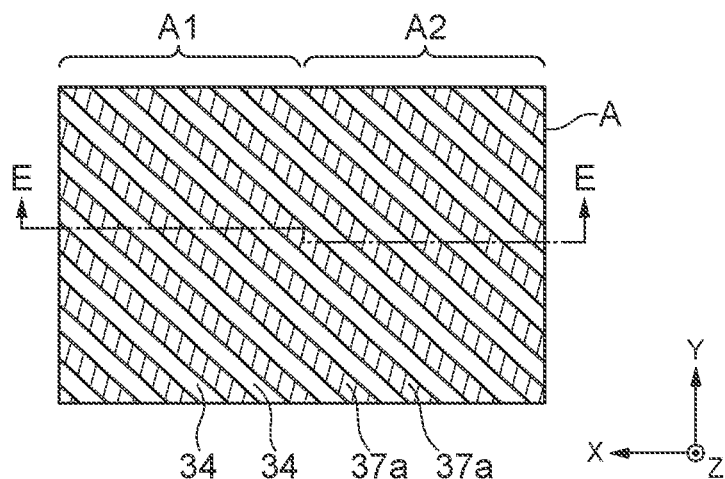
FIGS. 4A and 4B are diagrams illustrating the method of forming the semiconductor memory device according to the embodiment, and are a plan-view layout and a longitudinal section illustrating a schematic configuration of the memory cell region and the array edge region in an exemplary process stage following FIGS. 3A and 3B.
Figure 4B:
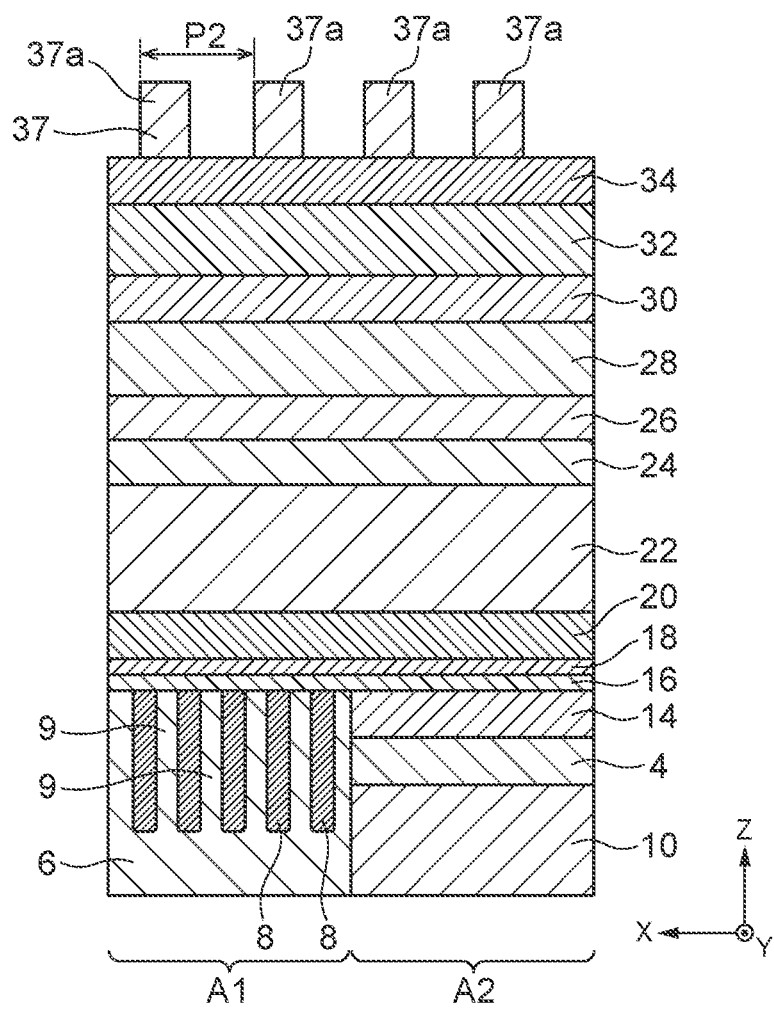

As illustrated in FIGS. 4A and 4B, anisotropic dry etching is performed on the sacrificial film 37 to etch back the sacrificial film 37 so that the sacrificial film 37 remains on the side walls of the resist patterns 36, thereby forming a plurality of side wall portions 37a. During this period of time, the upper surfaces of the resist patterns 36 are exposed. Thereafter, the resist patterns 36 are removed. The side wall portions 37a form a line-and-space pattern, and the pitch P2 of the plurality of side wall portions 37a is half the pitch P1 of the resist patterns 36. The side wall portion 37a is formed as a line-shaped pattern.

Figure 5A:
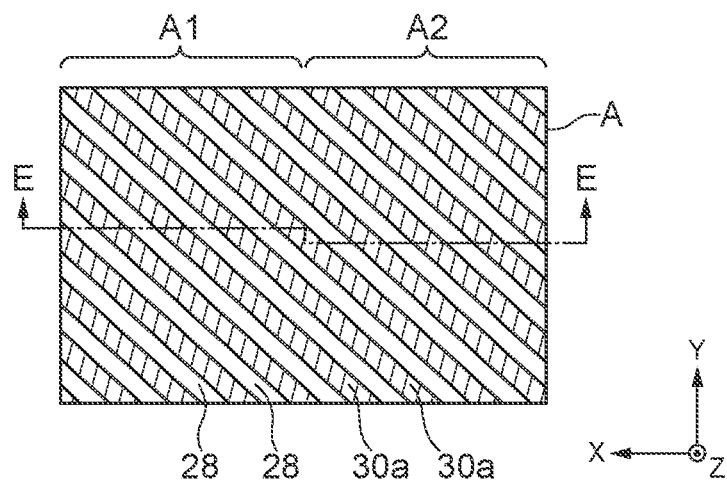
FIGS. 5A and 5B are diagrams illustrating the method of forming the semiconductor memory device according to the embodiment, and are a plan-view layout and a longitudinal section illustrating the schematic configuration of the memory cell region and the array edge region in an exemplary process stage following FIGS. 4A and 4B.
Figure 5B:
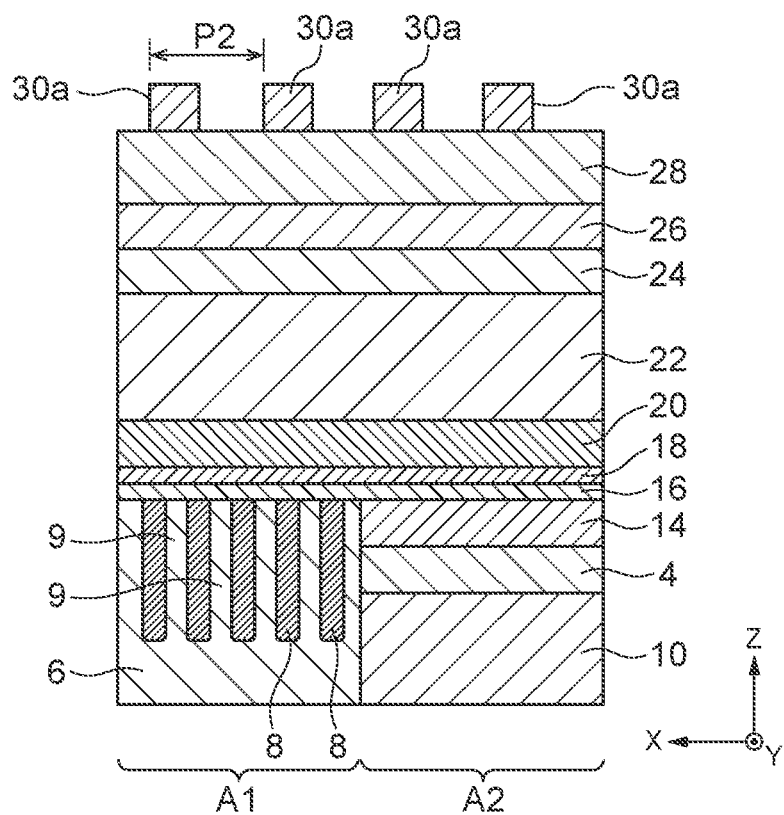

Subsequently, as illustrated in FIGS. 5A and 5B, anisotropic dry etching is performed on the seventh sacrificial film 34, the sixth sacrificial film 32, and the fifth sacrificial film 30 with the side wall portions 37a being used as etching masks. As a result, the pattern of the side wall portions 37a is transferred onto the fifth sacrificial film 30. The side wall portions 37a and the seventh sacrificial film 34 are removed during etching. At this time, the upper surface of the fourth sacrificial film 28 is exposed.

The sixth sacrificial film 32 is then removed, so that the pattern of the side wall portions 37a having the pitch P2 is transferred onto the fifth sacrificial film 30.

Through the above-described steps, as illustrated in FIGS. 5A and 5B, fifth sacrificial film patterns 30a having a pitch P2 which is half the pitch P1 are formed. The fifth sacrificial film patterns 30a form a line-and-space pattern having a pitch P2 that is half the pitch P1. Each of the patterned fifth sacrificial film patterns 30a forms a line-shaped pattern.

Figure 6A:
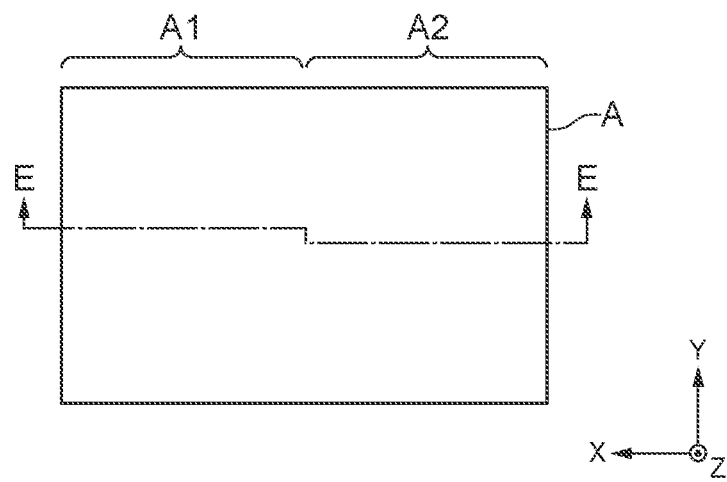
FIGS. 6A and 6B are diagrams illustrating the method of forming the semiconductor memory device according to the embodiment, and are a plan-view layout and a longitudinal section illustrating the schematic configuration of the memory cell region and the array edge region in an exemplary process stage following FIGS. 5A and 5B.
Figure 6B:
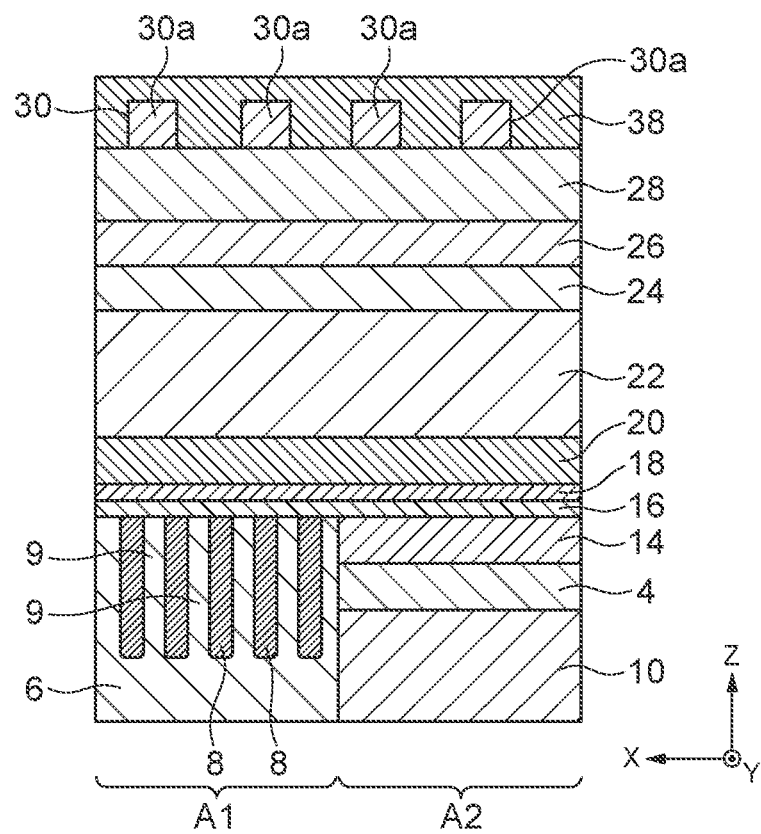

Next, as illustrated in FIGS. 6A and 6B, an eighth sacrificial film 38 is formed so as to cover the upper surface of the fourth sacrificial film 28 and the fifth sacrificial film patterns 30a. The eighth sacrificial film 38 contains, for example, carbon. The eighth sacrificial film 38 is formed, for example, by coating of a BARC (Bottom anti-reflective coating) film and a curing treatment using baking.

Figure 7A:
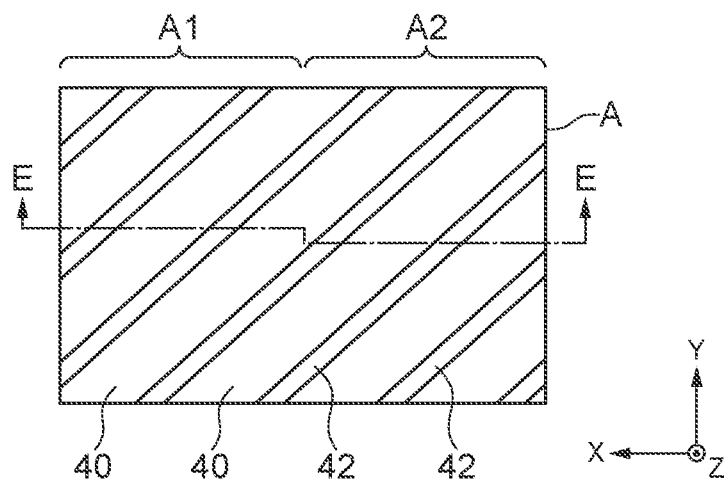
FIGS. 7A and 7B are diagrams illustrating the method of forming the semiconductor memory device according to the embodiment, and are a plan-view layout and a longitudinal section illustrating the schematic configuration of the memory cell region and the array edge region in an exemplary process stage following FIGS. 6A and 6B.
Figure 7B:
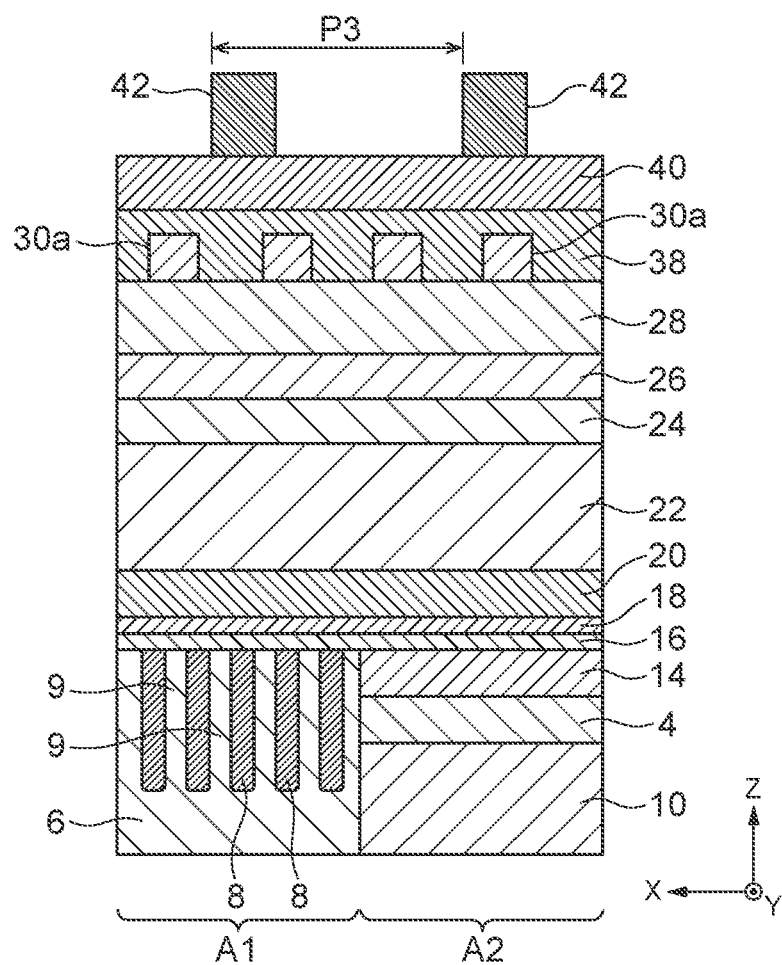

As illustrated in FIGS. 7A and 7B, a ninth sacrificial film 40 is formed on the eighth sacrificial film 38. The ninth sacrificial film 40 contains, for example, silicon oxynitride. The ninth sacrificial film 40 is formed, for example, by using CVD. Subsequently, a plurality of resist patterns 42 are formed on the ninth sacrificial film 40. The resist patterns 42 are formed by the publicly-known lithography technique. As illustrated in FIG. 7A, the resist patterns 42 are formed so as to form a line-and-space pattern inclining from the lower left to the upper right in FIG. 7A. The resist patterns 42 are arranged in parallel so as to form a plurality of line-shaped periodic patterns having a pitch P3.

Figure 8A:
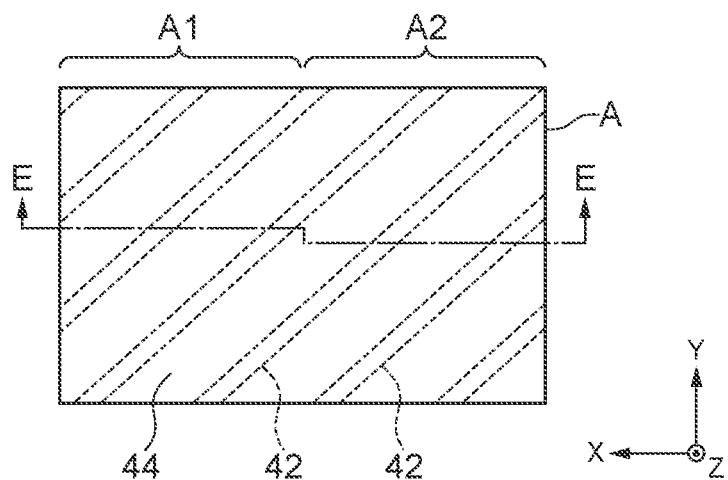
FIGS. 8A and 8B are diagrams illustrating the method of forming the semiconductor memory device according to the embodiment, and are a plan-view layout and a longitudinal section illustrating the schematic configuration of the memory cell region and the array edge region in an exemplary process stage following FIGS. 7A and 7B.
Figure 8B:
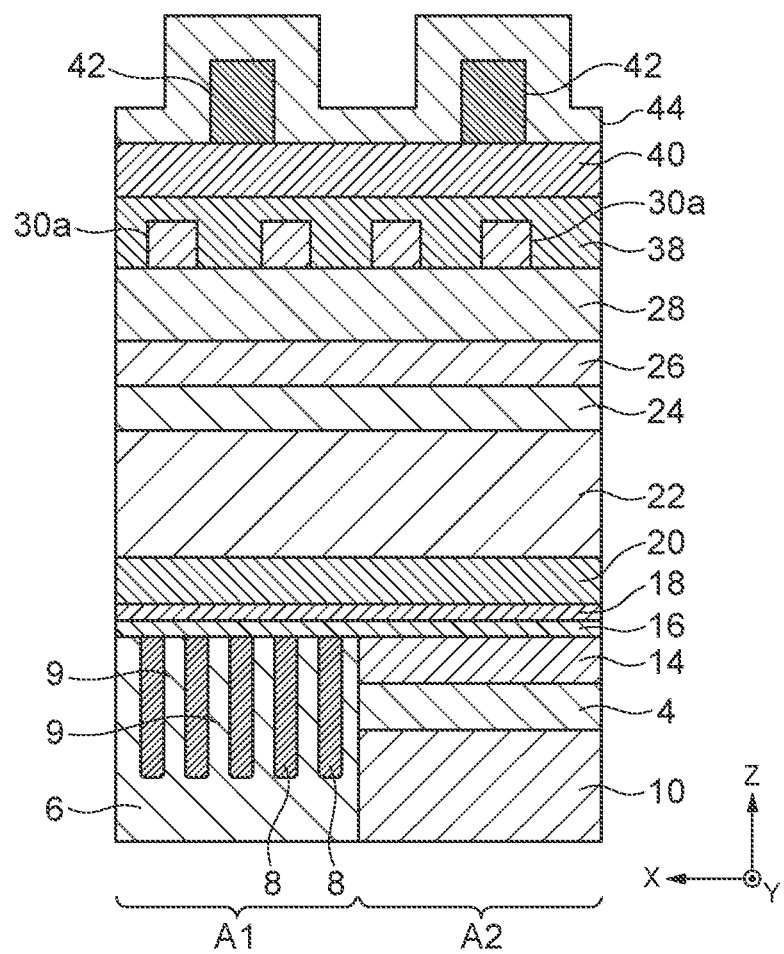

Subsequently, as described below, the pitch doubling processing is performed to form patterns having a pitch P4 which is half the pitch P3 with formation of the resist patterns 42 having the pitch P3 as a starting point. The pitch doubling processing has the following steps. First, as illustrated in FIGS. 8A and 8B, a tenth sacrificial film 44 is formed on the ninth sacrificial film 40 and the resist patterns 42. The tenth sacrificial film 44 contains an insulating material, for example, contains silicon dioxide. The tenth sacrificial film 44 is formed, for example, by using a plasma ALD (atomic layer deposition) technique or a low temperature plasma ALD technique. The tenth sacrificial film 44 is formed so as to follow the shapes of the resist patterns 42.

Figure 9A:
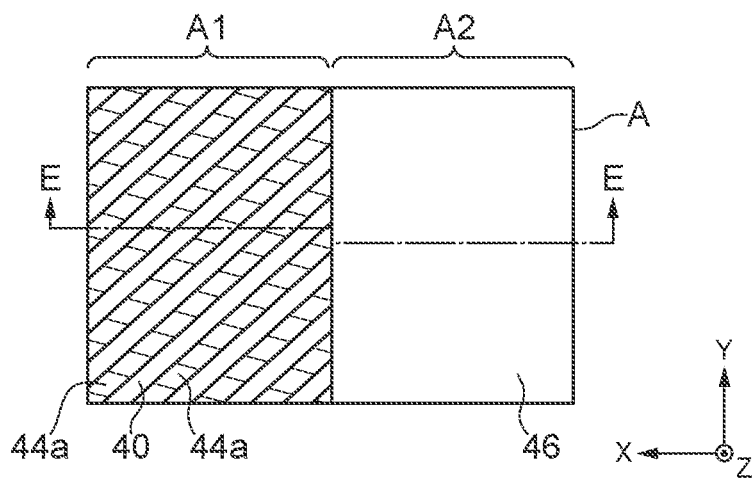
FIGS. 9A and 9B are diagrams illustrating the method of forming the semiconductor memory device according to the embodiment, and are a plan-view layout and a longitudinal section illustrating the schematic configuration of the memory cell region and the array edge region in an exemplary process stage following FIGS. 8A and 8B.
Figure 9B:
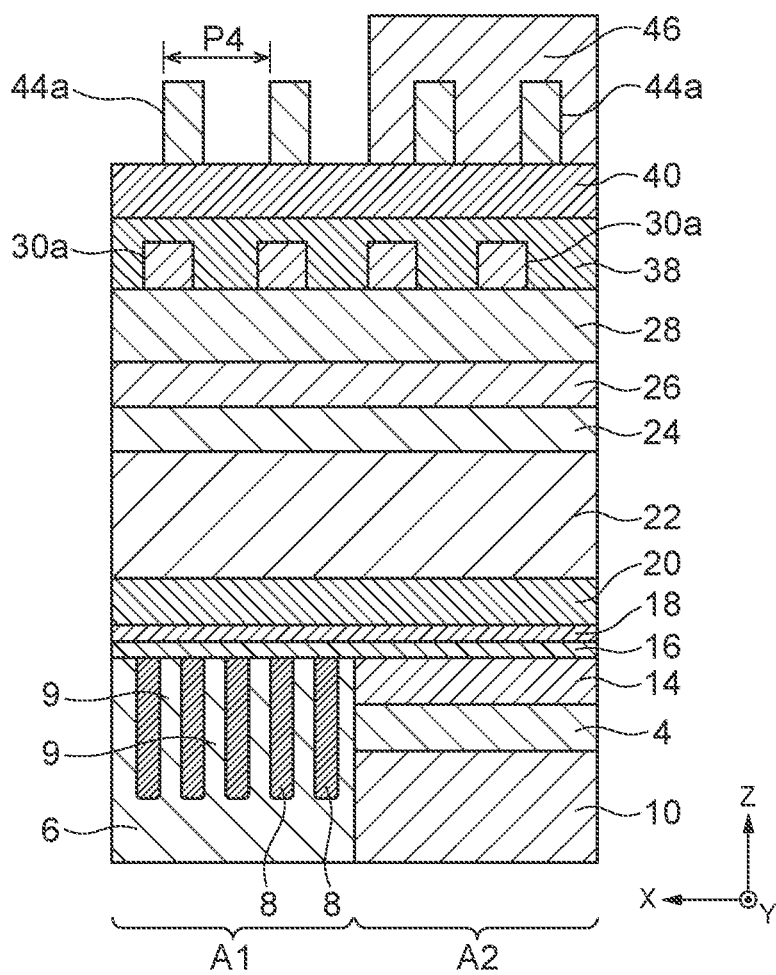

Subsequently, as illustrated in FIGS. 9A and 9B, anisotropic dry etching is performed on the tenth sacrificial film 44 to etch back the tenth sacrificial film 44 so that the tenth sacrificial film 44 remains on the side walls of the resist patterns 42, thereby forming a plurality of side wall portions 44a. At this time, the upper surfaces of the resist patterns 42 are exposed. Thereafter, the resist patterns 42 are removed. The side wall portions 44a form a line-and-space pattern, and the pitch P4 of the plurality of side wall portions 44a is half the pitch P3 of the resist patterns 42. The side wall portions 44a intersect the fifth sacrificial film patterns 30a. The side wall portion 44a forms a line-shaped pattern.

Subsequently, a resist pattern 46 is formed on a region containing the array edge region A2. The resist pattern 46 is formed so as to cover the ninth sacrificial film 40 and the side wall portion 44a in the array edge region A2. The resist pattern 46 is patterned by the publicly-known lithography technique so as to expose the portion corresponding to the memory cell region A1 and cover the portion corresponding to the array edge region A2.

Figure 10A:
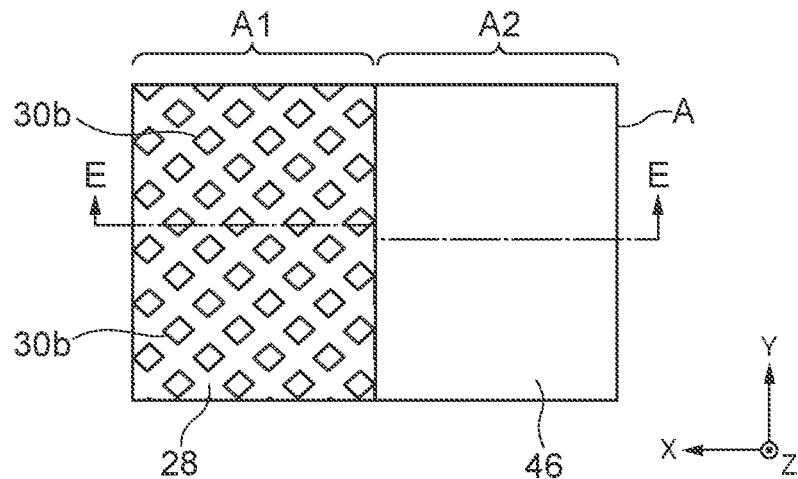
FIGS. 10A and 10B are diagrams illustrating the method of forming the semiconductor memory device according to the embodiment, and are a plan-view layout and a longitudinal section illustrating the schematic configuration of the memory cell region and the array edge region in an exemplary process stage following FIGS. 9A and 9B.
Figure 10B:
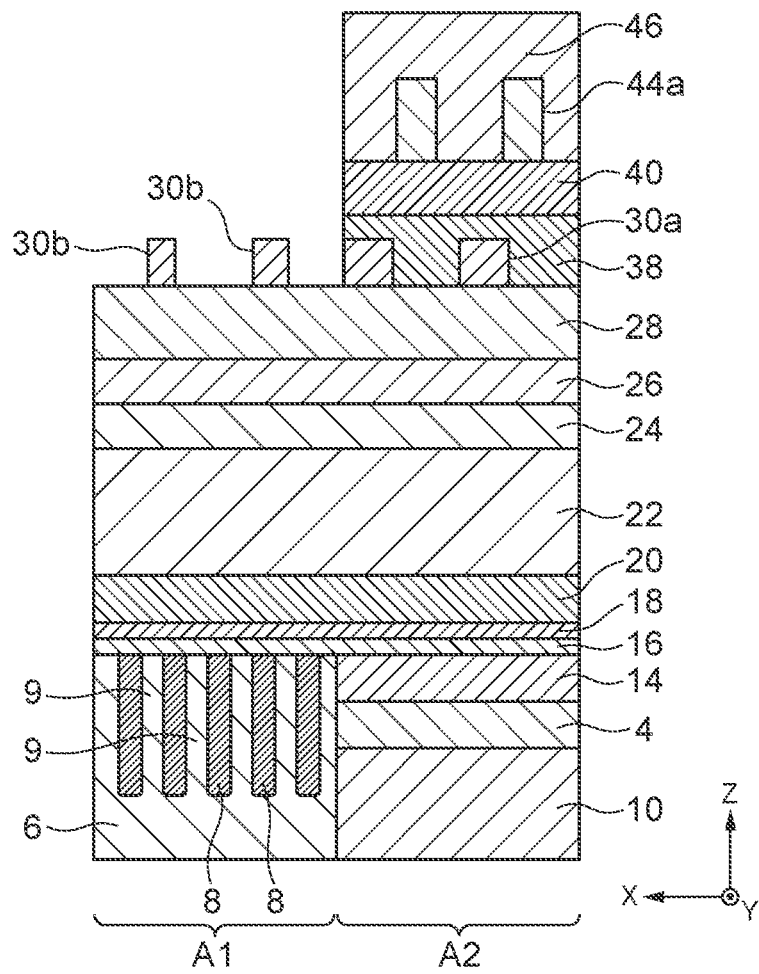

Subsequently, as illustrated in FIGS. 10A and 10B, anisotropic dry etching is performed on the ninth sacrificial film 40, the eighth sacrificial film 38 and the side wall portions 44a with the side wall portions 44a in the memory cell region A1 and the resist pattern 46 in the array edge region A2 being used as masks. The fifth sacrificial film patterns 30a forming a line-and-space pattern are formed so as to intersect the side wall portions 44a forming a line-and-space pattern. Therefore, in the memory cell region A1, residual portions of the fifth sacrificial film patterns 30a after etching serve as a plurality of island patterns 30b. The island patterns 30b correspond to the intersection portions between the fifth sacrificial film patterns 30a and the side wall portions 44a. At this time, the upper surface of the fourth sacrificial film 28 is exposed in the memory cell region A1. Subsequently, the side wall portions 44a, the ninth sacrificial film 40, and the eighth sacrificial film 38 in the memory cell region A1 are removed.

Figure 11A:
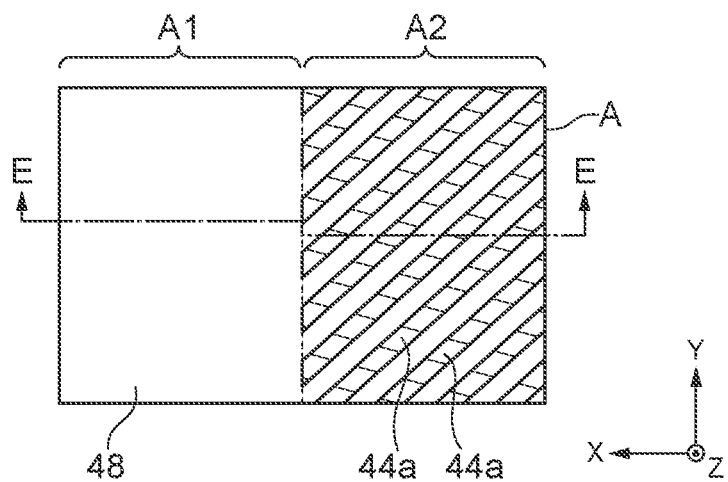
FIGS. 11A and 11B are diagrams illustrating the method of forming the semiconductor memory device according to the embodiment, and are a plan-view layout and a longitudinal section illustrating the schematic configuration of the memory cell region and the array edge region in an exemplary process stage following FIGS. 10A and 10B.
Figure 11B:
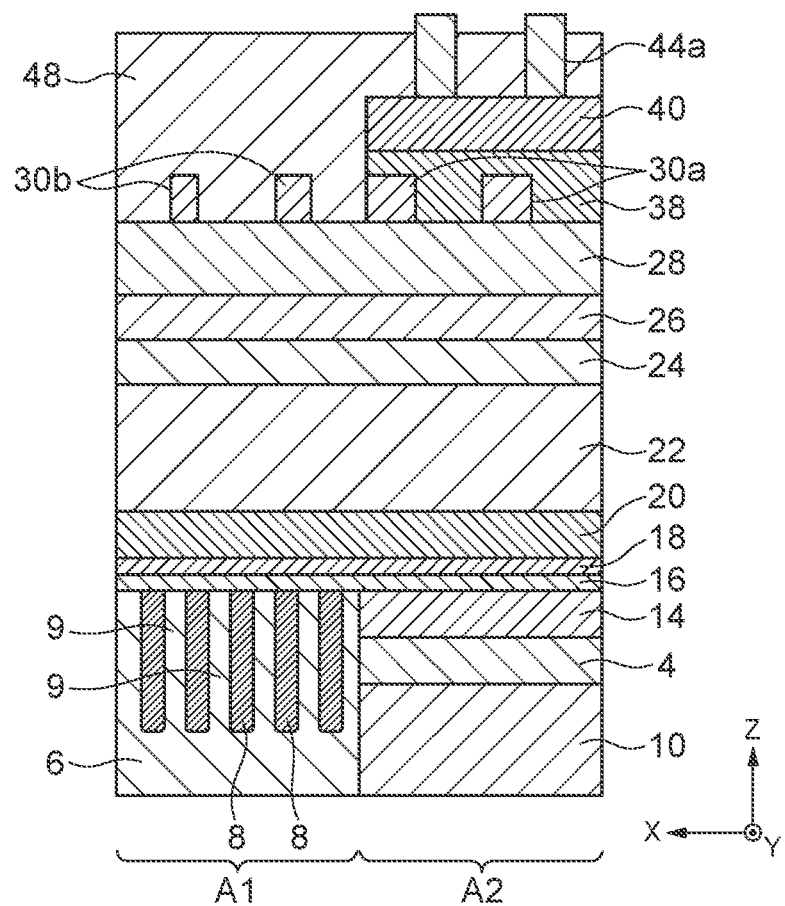

Subsequently, as illustrated in FIGS. 11A and 11B, the resist pattern 46 in the array edge region A2 is removed to expose the side wall portions 44a in the array edge region A2. Subsequently, an eleventh sacrificial film 48 is formed so as to cover the fourth sacrificial film 28 and the plurality of island patterns 30b in the memory cell region A1, and the ninth sacrificial film 40 and the side wall portions 44a in the array edge region A2. The eleventh sacrificial film 48 contains, for example, carbon. The eleventh sacrificial film 48 is formed, for example, by using CVD. Subsequently, etching is performed on the eleventh sacrificial film 48 so as to etch back the eleventh sacrificial film 48 and expose vertex portions of the side wall portions 44a.

Figure 12A:
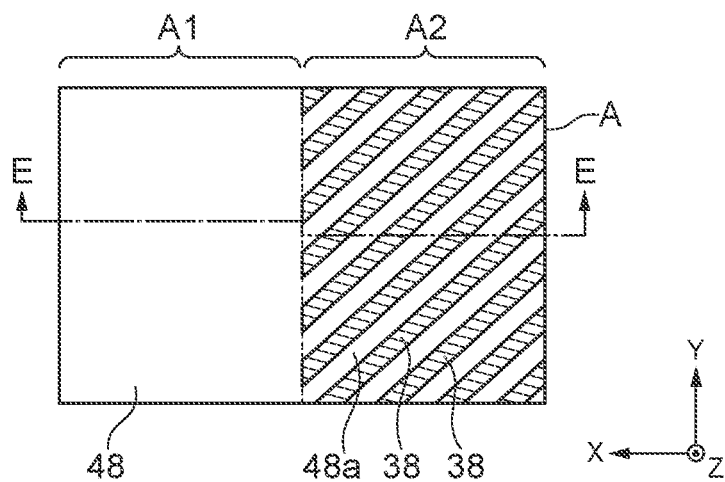
FIGS. 12A and 12B are diagrams illustrating the method of forming the semiconductor memory device according to the embodiment, and are a plan-view layout and a longitudinal section illustrating the schematic configuration of the memory cell region and the array edge region in an exemplary process stage following FIGS. 11A and 11B.
Figure 12B:
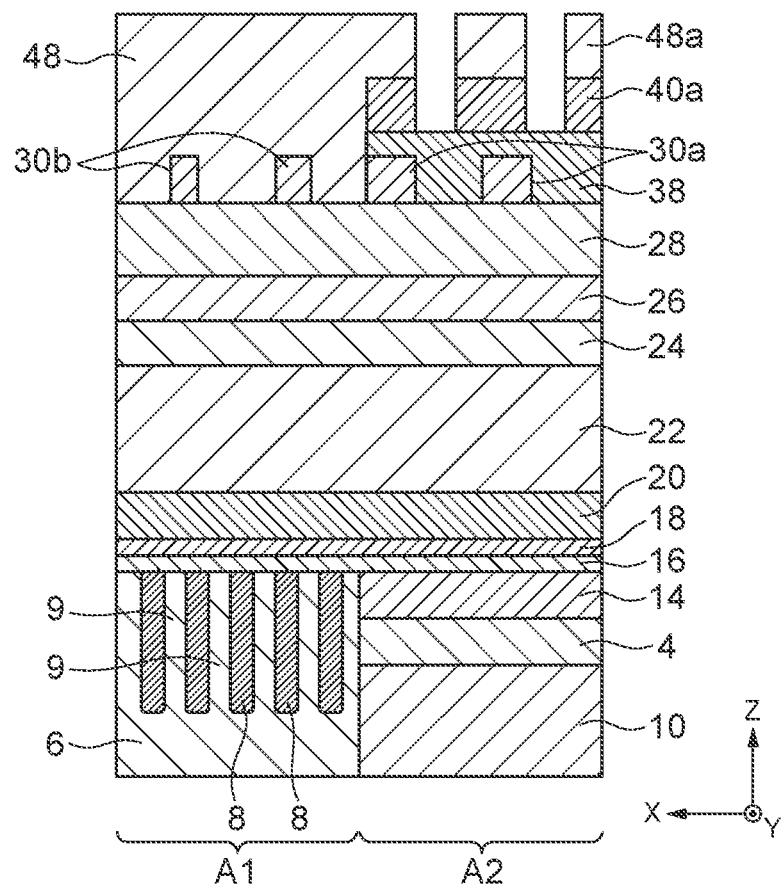

Subsequently, as illustrated in FIGS. 12A and 12B, the side wall portions 44a are etched and removed. After the side wall portions 44a have been removed, the residual eleventh sacrificial film 48 in the array edge region A2 becomes mask patterns 48a forming a line-and-space pattern. The mask patterns 48a are patterns which reverse the light and shade of the side wall portions 44a. Subsequently, the ninth sacrificial film 40 is patterned by performing anisotropic dry etching with the mask patterns 48a being used as masks. As a result, in the array edge region A2, the shapes of the mask patterns 48a are transferred onto the ninth sacrificial film 40 to form third mask patterns 40a. At this time, the upper surface of the eighth sacrificial film 38 is exposed.

Figure 13A:
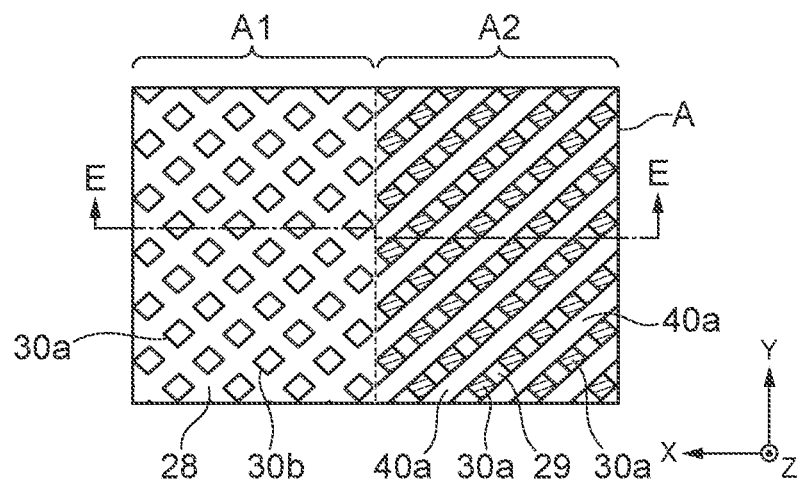
FIGS. 13A and 13B are diagrams illustrating the method of forming the semiconductor memory device according to the embodiment, and are a plan-view layout and a longitudinal section illustrating the schematic configuration of the memory cell region and the array edge region in an exemplary process stage following FIGS. 12A and 12B.
Figure 13B:
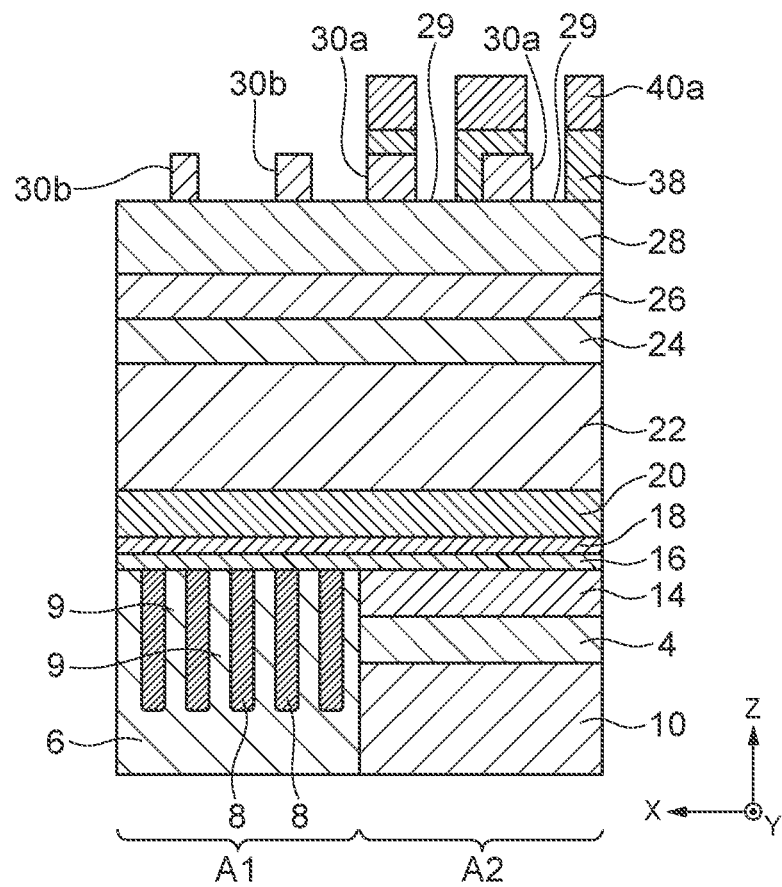
Figure 14A:
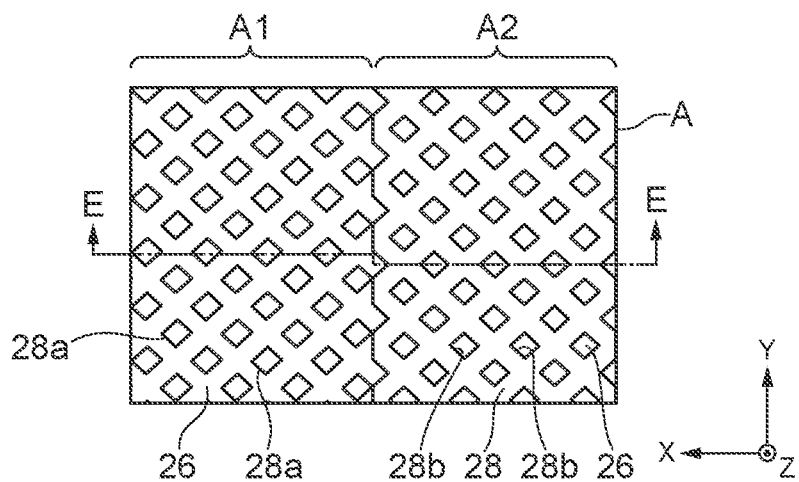
FIGS. 14A and 14B are diagrams illustrating the method of forming the semiconductor memory device according to the embodiment, and are a plan-view layout and a longitudinal section illustrating the schematic configuration of the memory cell region and the array edge region in an exemplary process stage following FIGS. 13A and 13B.
Figure 14B:
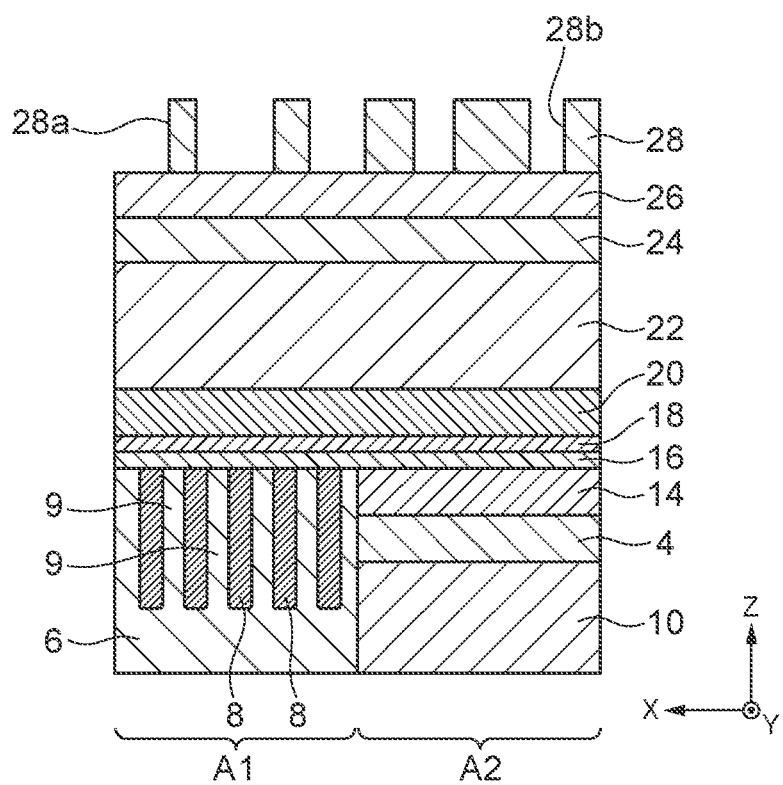

Subsequently, as illustrated in FIGS. 13A and 13B, anisotropic dry etching is performed on the eighth sacrificial film 38 with the mask patterns 48a and the third mask patterns 40a being used as etching masks. A plurality of hole patterns 29 are formed by the third mask patterns 40a and the fifth sacrificial film patterns 30a remaining after etching. This anisotropic dry etching is performed under a condition that the etching rate of the eighth sacrificial film 38 is sufficiently higher than the etching rate of the fifth sacrificial film patterns 30a.

Subsequently, etching is performed on the mask patterns 48a in the array edge region A2 and the eleventh sacrificial film 48 in the memory cell region A1 to selectively remove the mask patterns 48a and the eleventh sacrificial film 48. As a result, in the memory cell region A1, a plurality of island patterns 30b are exposed, and the upper surface of the fourth sacrificial film 28 is exposed. In the array edge region A2, the third mask patterns 40a, parts of the side surfaces of the fifth sacrificial film patterns 30a, and the upper surface of the fourth sacrificial film 28 are exposed. The plurality of hole patterns 29 formed in the array edge region A2 are arranged at positions which are shifted by half the pitch P4 in the Y direction from the positions of the plurality of island patterns 30b in the memory cell region A1.

Subsequently, as illustrated in FIGS. 13A and 13B, anisotropic dry etching is performed on the fourth sacrificial film 28 with the plurality of island patterns 30b, the plurality of third mask patterns 40a, and the fifth sacrificial film patterns 30a being used as etching masks. As a result, the plurality of island patterns 30b and the plurality of hole patterns 29 are transferred onto the fourth sacrificial film 28, so that the fourth sacrificial film 28 having a plurality of island patterns 28a and a plurality of hole patterns 28b is formed.

Subsequently, the island patterns 30b, the third mask patterns 40a, and the fifth sacrificial film patterns 30a are removed. Note that the etching steps from FIGS. 12A and 12B to FIGS. 15A and 15B can be continuously performed in the same etching apparatus under different etching conditions.

Figure 15A:
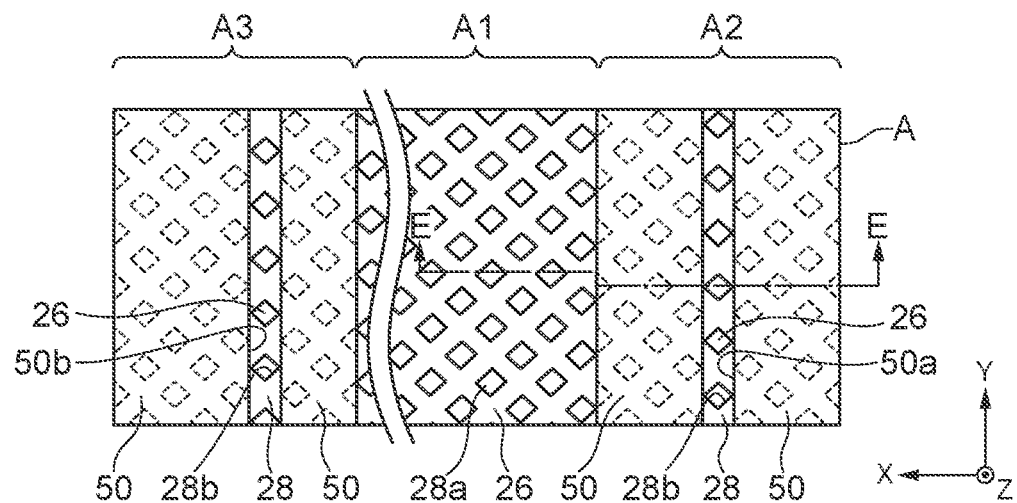
FIGS. 15A and 15B are diagrams illustrating the method of forming the semiconductor memory device according to the embodiment, and are a plan-view layout and a longitudinal section illustrating the schematic configuration of the memory cell region and the array edge region in an exemplary process stage following FIGS. 14A and 14B.
Figure 15B:
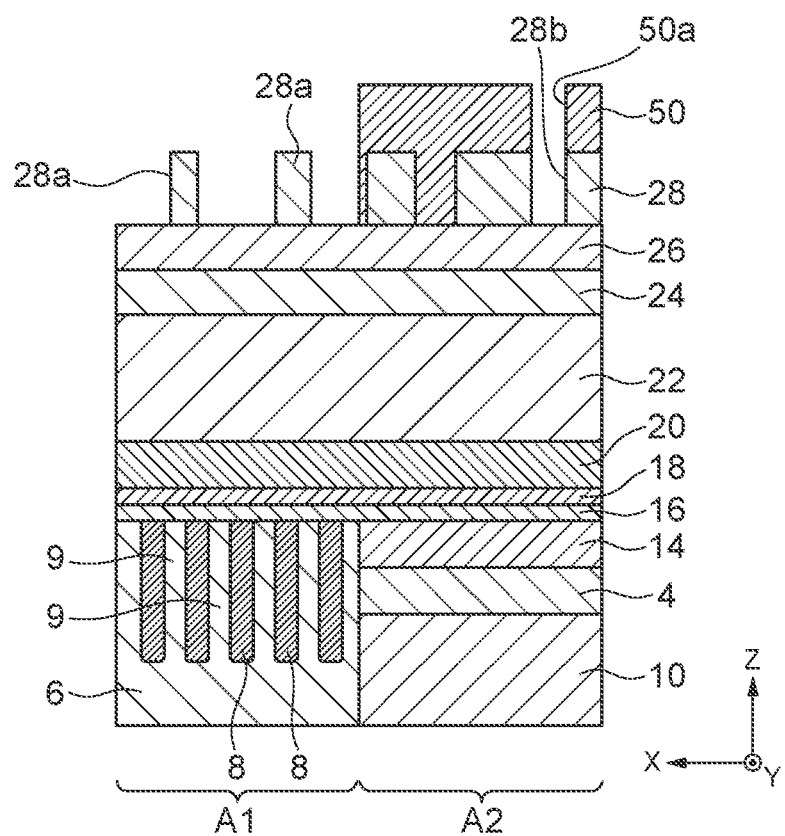

Subsequently, resist patterns 50 are formed as illustrated in FIGS. 15A and 15B. As for the resist patterns 50, the array edge region A2 and an array edge region A3 which are arranged so as to sandwich the memory cell region A1 therebetween in the X direction are illustrated in FIG. 15A. The resist patterns 50 are formed in the array edge region A2 and the array edge region A3, but no resist pattern 50 is formed in the memory cell region A1. The resist patterns 50 are patterned by the publicly-known lithography technique.

In the array edge region A2, a slit 50a through which hole patterns 28b on one column in the Y direction are exposed is formed in the resist pattern 50. The slit 50a serves as an opening for forming a word-line contact for every other word-line 4. A slit 50b through which hole patterns 28b on one row in the Y direction is formed in the array edge region A3. The slit 50b serves as an opening for forming a word-line contact for every other word-line 4. The slit 50b of the array edge region A3 is positioned so as to expose therethrough hole patterns 28b which are displaced by half the pitch P4 in the Y direction from the hole patterns 28b exposed through the slit 50a of the array edge region A2.

Figure 16:
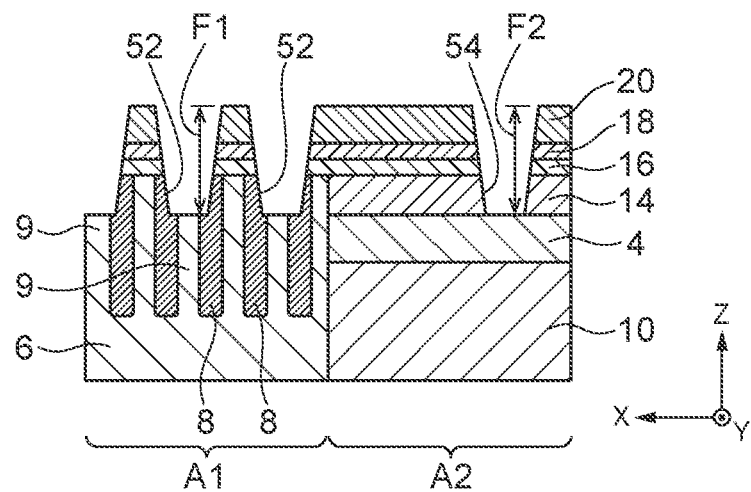
FIG. 16 is a diagram illustrating the method of forming the semiconductor memory device according to the embodiment, and is a longitudinal section illustrating the schematic configuration of the memory cell region and the array edge region in an exemplary process stage following FIG. 15B.

Subsequently, as illustrated in FIG. 16, anisotropic dry etching is performed on the third sacrificial film 26, the second sacrificial film 24, the first sacrificial film 22, the fifth insulating film 20, the fourth insulating film 18, the third insulating film 16, the active regions 9 of the memory cell region A1, and the second insulating film 14 of the array edge region A2 with the resist pattern 50, the island pattern 28a, and the hole patterns 28b being used as etching masks. The island pattern 28a and the hole pattern 28b function as one etching mask pattern. The anisotropic dry etching is performed under an etching condition that the etching rate of the active regions 9 of the memory cell region A1 and the etching rate of the second insulating film 14 of the array edge region A2 are substantially equal to each other. The resist pattern 50, the fourth sacrificial film 28, the third sacrificial film 26, and the second sacrificial film 24 are removed during etching.

Subsequently, the first sacrificial film 22 is removed. As a result, as illustrated FIG. 16, recesses 52 which are recessed in a way that the surfaces of the active regions 9 are dug down are formed in the memory cell region A1. In the array edge region A2, a first hole 54 extending from the upper surface of the fifth insulating film 20 to the upper surface of the word-line 4 is formed. The upper surface of the word-line 4 is exposed in the first hole 54.

The first hole 54 has a reversed tapered shape with a wide top and a narrow bottom. With reference to the upper surface of the fifth insulating film 20, the recesses 52 have a depth F1 from the upper surface of the fifth insulating film 20, and the first hole 54 has a depth F2 from the upper surface of the fifth insulating film 20. The depth F1 and the depth F2 are substantially equal to each other.

In the present embodiment, the height positions of the bottom surfaces of the recesses 52 of the memory cell region A1 and the height positions of the upper surfaces of the word-lines 4 in the array edge region A2 are substantially the same. By increasing the film thickness of the first insulating film 10, the height positions of the bottom surfaces of the recesses 52 in the memory cell region A1 and the height positions of the upper surfaces of the word-lines 4 are adjusted to be substantially the same.

Figure 17:
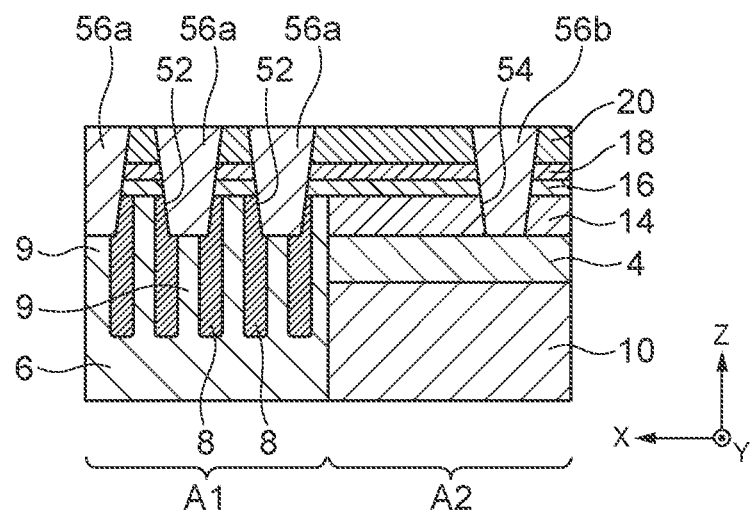
FIG. 17 is a diagram illustrating the method of forming the semiconductor memory device according to the embodiment, and is a longitudinal section illustrating the schematic configuration of the array edge region and a peripheral circuit region in an exemplary process stage following FIG. 16.

Subsequently, as illustrated in FIG. 17, conductive materials 56a and a conductive material 56b are formed so as to be filled in the recesses 52 and the first hole 54, respectively. The conductive materials 56a and the conductive material 56b contain, for example, tungsten (W). The conductive materials 56a and the conductive material 56b are formed as follows. First, films of tungsten are formed so as to be filled in the recesses 52 and the first hole 54 and coated on the upper surface of the fifth insulating film 20 by using CVD. Subsequently, anisotropic dry etching is performed until the upper surface of the fifth insulating film 20 is exposed. As a result, the conductive materials 56a and the conductive material 56b remain in the recesses 52 and the first hole 54, respectively. The conductive materials 56a and the conductive material 56b are formed by the above steps.

The conductive material 56a becomes a part of the bit-line contact connected to the surface of the active region 9. The conductive material 56b becomes a lower contact electrode 60 included in the word-line contact 82 as described later. In the present embodiment, the conductive material 56a and the conductive material 56b are formed in the same step.

According to the semiconductor memory device of the present embodiment, the height position of the bottom surface of the recess 52 in the memory cell region A1 and the height position of the upper surface of the word-line 4 are substantially the same. In some embodiments, the height position of the upper surface of the word-line 4 and the height position of a lower surface of the bit-line contact are substantially the same. In some embodiments, the height position of a lower surface of the contact electrode 60 and the height position of a lower surface of the bit-line contact are substantially the same. This configuration makes it possible to reduce an over-etching amount when the recesses 52 in the memory cell region A1 are formed. As a result, it is possible to suppress an increase in the capacitance between the bit-line contact and the word-line 4. In addition, it is possible to suppress short-circuit between the bit-line contact and the word-line 4.

Figure 18:
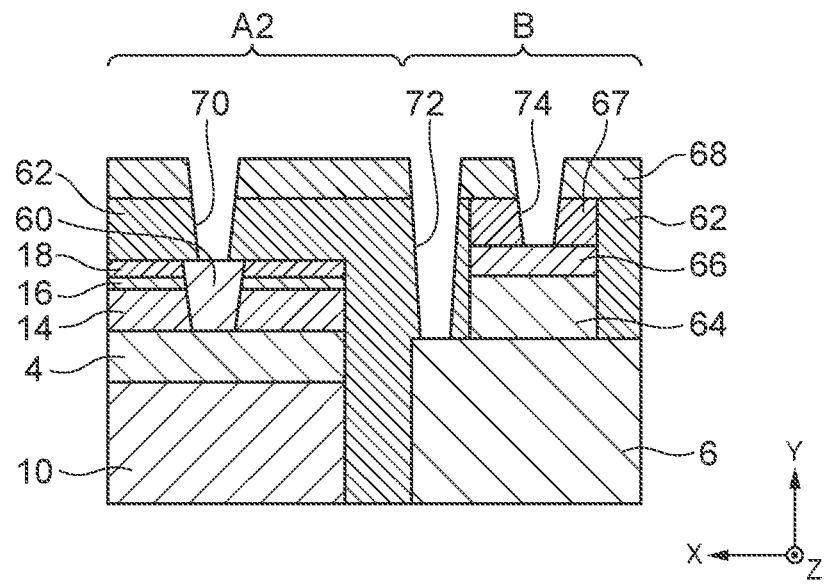
FIG. 18 is a diagram illustrating the method of forming the semiconductor memory device according to the embodiment, and is a longitudinal section illustrating the schematic configuration of the array edge region and the peripheral circuit region in an exemplary process stage following FIG. 17.

Subsequently, steps following FIG. 17 will be described with reference to FIG. 18. FIG. 18 illustrates the array edge region A2 and a peripheral circuit region B. Peripheral circuits such as a row decoder and a row address buffer (not illustrated) are arranged in the peripheral circuit region B. FIG. 18 also illustrates a multilayer structure of a conductive material 64 and a conductive material 66 which constitute gate electrodes of transistors included in circuits such as the row decoder and the row address buffer. A cap insulating material 67 is provided on the conductive material 66.

The conductive material 64 and the conductive material 66 are provided on the semiconductor substrate 6. The conductive material 64 contains, for example, polysilicon. The conductive material 66 contains, for example, tungsten. The cap insulating material 67 contains, for example, silicon nitride. The conductive material 64, the conductive material 66, and the cap insulating material 67 are formed, for example, by using CVD. Subsequently, the laminate of the conductive material 64, the conductive material 66, and the cap insulating material 67 is patterned by using the publicly-known lithography technique and anisotropic dry etching.

In such a configuration, the fourth insulating film 18 and the lower contact electrode 60 in the array edge region A2, and a sixth insulating film 62 covering the conductive material 64, the conductive material 66 and the cap insulating material 67 in the peripheral circuit region B are formed. The sixth insulating film 62 contains, for example, silicon dioxide. The sixth insulating film 62 is formed, for example, by using CVD.

Subsequently, anisotropic dry etching is performed on the sixth insulating film 62 to etch back the sixth insulating film 62 to the extent that the upper surface of the cap insulating material 67 is exposed. Subsequently, a seventh insulating film 68 that covers the sixth insulating film 62 and the cap insulating material 67 is formed. The seventh insulating film 68 contains, for example, silicon nitride. The seventh insulating film 68 is formed, for example, by using CVD.

Subsequently, the publicly-known lithography technique and anisotropic dry etching are performed to form a second hole 70 extending from the upper surface of the seventh insulating film 68 to the upper surface of the lower contact electrode 60 in the array edge region A2. Further, a third hole 72 extending from the upper surface of the seventh insulating film 68 to the upper surface of the semiconductor substrate 6 is formed in the peripheral circuit region B. In addition, a fourth hole 74 extending from the upper surface of the seventh insulating film 68 to the upper surface of the conductive material 66 is formed in the peripheral circuit region B where the peripheral circuits will be formed.

Figure 19:
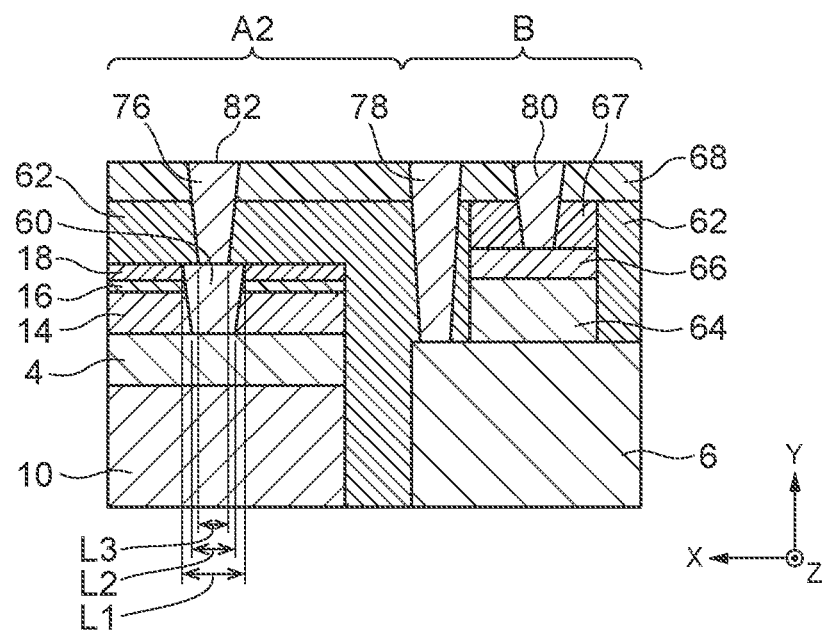
FIG. 19 is a diagram illustrating the method of forming the semiconductor memory device according to the embodiment, and is a longitudinal section illustrating the schematic configuration of the array edge region and the peripheral circuit region in an exemplary process stage following FIG. 18.

Subsequently, as illustrated in FIG. 19, an upper contact electrode 76, a peripheral contact electrode 78, and a peripheral contact electrode 80 are formed at upper portions of the second hole 70, the third hole 72, and the fourth hole 74, respectively. The upper contact electrode 76, the peripheral contact electrode 78, and the peripheral contact electrode 80 are formed as follows. Films of a conductive material is formed so as to be filled in the second hole 70, the third hole 72 and the fourth hole 74 and coated on the seventh insulating film 68. The conductive material includes, for example, titanium (Ti), titanium nitride (TiN), and tungsten. The conductive material is formed, for example, by using CVD.

Subsequently, anisotropic etching is performed on the conductive material until the upper surface of the seventh insulating film 68 has been exposed, thereby removing the conductive material on the seventh insulating film 68, and leaving the conductive material in the second hole 70, the third hole 72 and the fourth hole 74. As a result, the upper contact electrode 76, the peripheral contact electrode 78, and the peripheral contact electrode 80 are formed.

Through the above-described steps, the semiconductor memory device according to the present embodiment is formed. The word-line contact 82 is formed as a two-stage contact having the upper contact electrode 76 and the lower contact electrode 60. In the present embodiment, the lower contact electrode 60 of the word-line contact 82, in other words, the conductive material 56b, and the conductive material 56a serving as the bit-line contact are formed in the same step. The lower contact electrode 60 of the word-line contact 82 is formed by using the resist pattern 36 described with reference to FIGS. 3A and 3B and the resist pattern 42 described with reference to FIGS. 7A and 7B as prototype patterns. In the lithography step for forming the resist patterns 36 and the resist patterns 42, a step of forming an alignment mark to align an exposure mask with the semiconductor substrate is close to the step of forming the word-lines 4, so that accumulation of misalignment is small. Therefore, the amount of misalignment between the word-line 4 and the lower contact electrode 60 can be reduced.

The lower contact electrode 60 is formed so as to have a reversed tapered shape in which the upper end surface is larger than the lower end surface. In the extending direction of the word-line 4, in other words, in the X direction, the length L1 of the upper end of the lower contact electrode 60 is larger than the length L2 of the lower end. In the extending direction of the word-line 4, the length L1 of the upper end of the lower contact electrode 60 is larger than the length L3 of the lower end of the upper contact electrode 76. The size of the upper end surface of the lower contact electrode 60 is bigger than the size of the lower end surface of the upper contact electrode 76.

As a result, in the case where the upper contact electrode 76 is formed on the lower contact electrode 60, occurrence of disconnection can be suppressed even if misalignment occurs. Note that the upper contact electrode 76 is also formed to have a reversed tapered shape in which the upper end surface is larger than the lower end surface.

Figure 20:
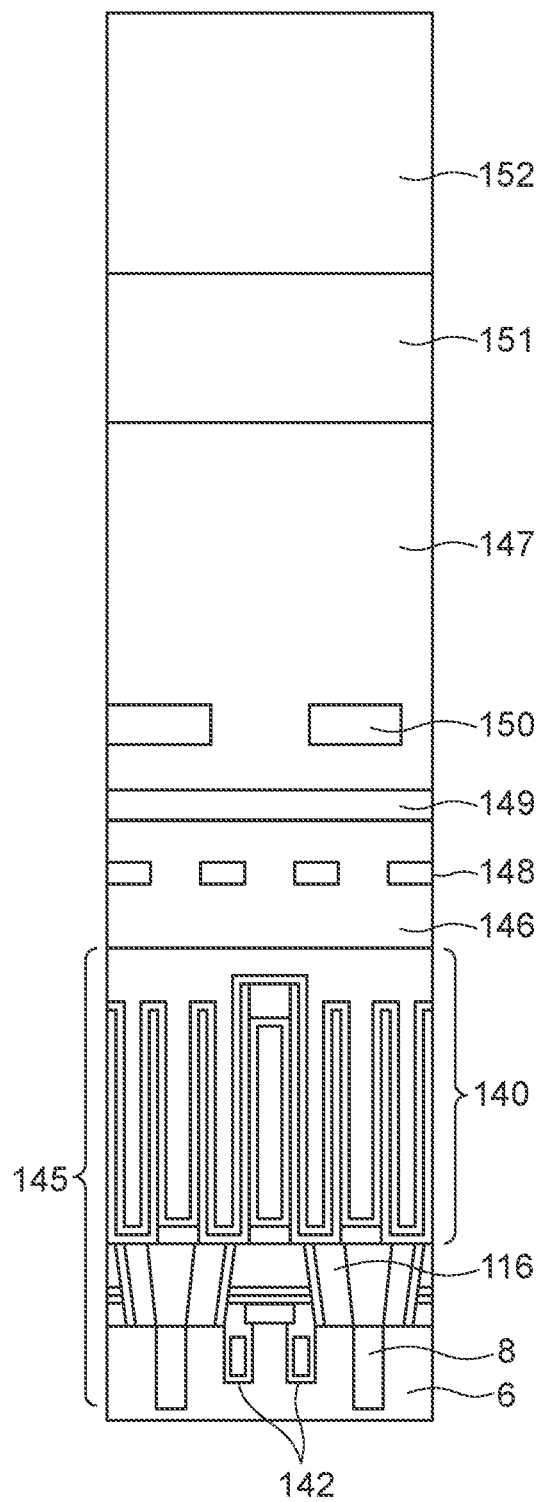
FIG. 20 is a longitudinal section illustrating an example of an overall schematic configuration of the memory cell region of the semiconductor memory device according to the embodiment.

FIG. 20 is a longitudinal section illustrating an example of an overall schematic configuration of the memory cell region of the semiconductor memory device according to the present embodiment. As illustrated in FIG. 20, a semiconductor substrate 6, an isolation region 8, an access transistor 142, a capacitor contact 116 and the like which are included in a DRAM memory cell 145 are provided below a capacitor 140. The capacitor 140 is provided on the semiconductor substrate 6 on which the isolation region 8, the access transistors 142, the capacitor contact 116, and the like are formed.

A bottom electrode of the capacitor 140 illustrated in FIG. 20 is electrically connected, through the capacitor contact 116, to one side of a source-drain region of the access transistor 142 formed in the active region of the semiconductor substrate 6. The bottom electrode of the capacitor 140 is connected to the semiconductor substrate 6. The gate electrode of the access transistor 142 corresponds to the word-lines 4 illustrated in FIG. 2, FIG. 3B, and the like.

As illustrated in FIG. 20, an upper layer portion which includes multilevel upper wiring wiring layers such as interconnects 148, 149, 150, and 151 is provided above the capacitor 140. The upper layer portion is disposed above the memory cell 145. A top electrode of the capacitor 140 is disposed near the multilevel upper wiring wirings layers containing components such as the interconnects 148, 149, 150, and 151. Elements 146, 147, and 152 illustrated in FIG. 20 contain an insulating material.

Figure 21:
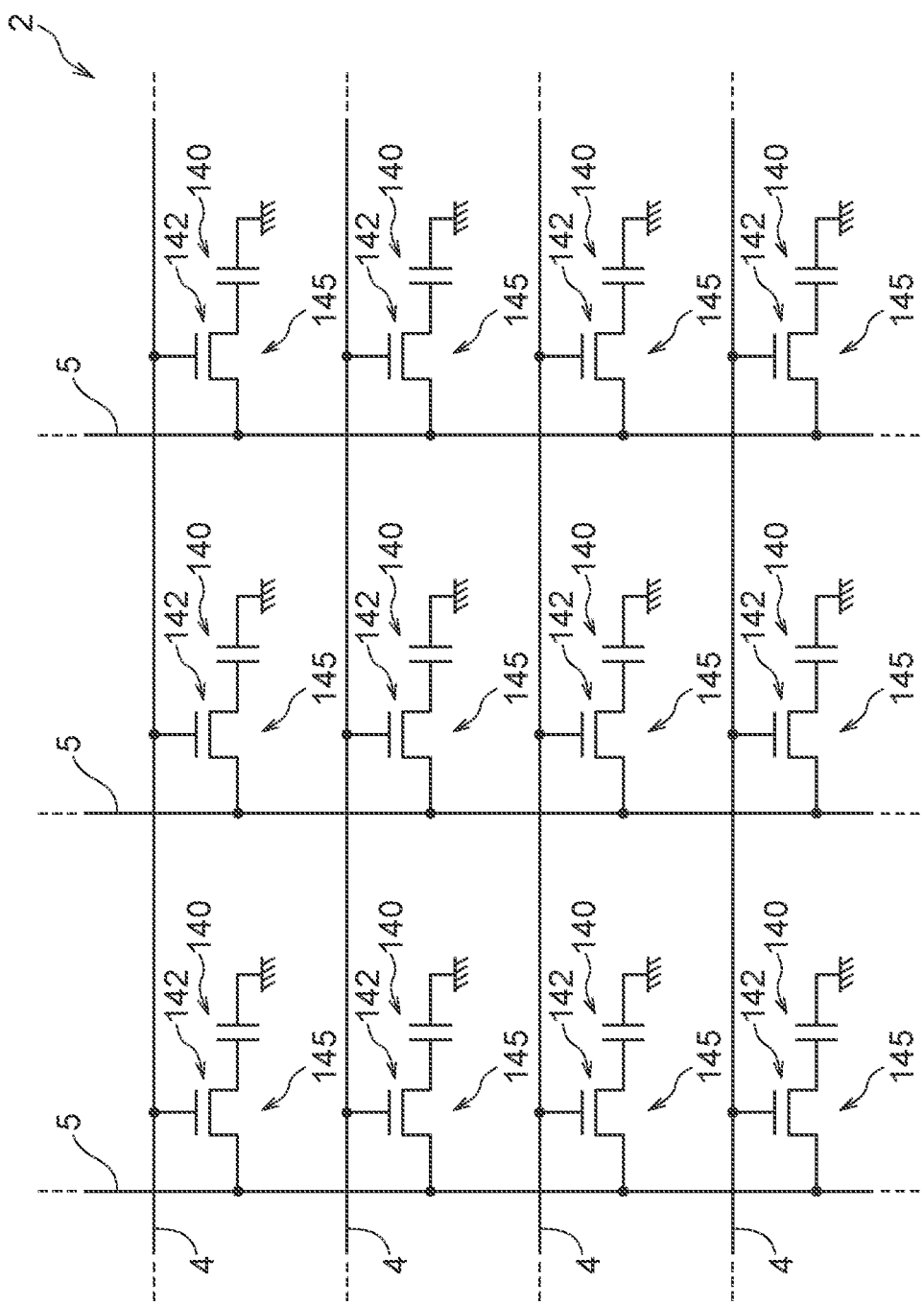
FIG. 21 is a circuit diagram illustrating a schematic configuration of an equivalent circuit of memory cells of the semiconductor memory device according to the embodiment.

FIG. 21 illustrates an equivalent circuit of a memory cell array of the semiconductor memory device according to the embodiment. A plurality of memory cells 145 are arranged in a matrix, with each memory cell 145 being connected to each intersection point between the plurality of word-lines 4 and the plurality of bit-lines 5 which are disposed orthogonally to each other. Each memory cell 145 includes a pair of the access transistor 142 and the capacitor 140.

The access transistor 142 includes, for example, a metal-oxide-semiconductor field-effect transistor (MOSFET). The gate electrode of the access transistor 142 functions as the DRAM word-line 4. The word-line 4 functions as a control line that controls the selection of the corresponding memory cell. One of the source and drain of the access transistor 142 is connected to the bit-line 5, while the other is connected to the capacitor 140. The capacitor 140 includes a condenser, and charges are accumulated in the condenser to store data.

When writing data to the memory cell 145, a potential that turns on the access transistor 142 is applied to the word-line 4, while a low potential or a high potential corresponding to writing data "0" or "1" is applied to the bit-line 5. When reading out data from the memory cell 145, a potential that turns on the access transistor 142 is applied to the word-line 4. As a result, the potential drawn out from the capacitor 140 to the bit-line 5 is sensed by a sense amplifier connected to the bit-line 5, whereby data determination is made.

According to the semiconductor memory device of the embodiment and the method of forming the same, the lower contact electrode 60 of the word-line contact 82 is formed in a reversed tapered shape, and configured so that the size of the upper end surface of the lower contact electrode 60 is bigger than the size of the lower end surface thereof. As a result, when the upper contact electrode 76 is formed on the lower contact electrode 60, a margin for alignment can be obtained. Therefore, it is possible to suppress occurrence of disconnection between the lower contact electrode 60 and the upper contact electrode 76.

In the semiconductor memory device of the embodiment, the recess 52 at which the surface of the active region is dug down and the first hole 54 extending to the surface of the word-line 4 are formed in the same step. The first hole 54 is a hole for forming the lower contact electrode 60. According to this configuration, the step of forming the alignment mark for the exposure mask to form the first hole 54 is close to the step of forming the word-line 4, so that the accumulation of misalignment is small. Therefore, the amount of misalignment between the word-line 4 and the lower contact electrode 60 can be reduced.

As described above, the semiconductor memory device according to the embodiment has been described by taking DRAM as an example, but this is an example and is not intended to be limited to DRAM. As the semiconductor memory device, memory devices other than DRAM, such as a static random access memory (SRAM), a flash memory, an erasable programmable read only memory (EPROM), a magnetoresistive random access Memory (MRAM), and a phase-change memory, are also conceivable.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:
1. A method comprising:
   forming a plurality of first line-shaped mask patterns over a substrate including a memory cell region and an array edge region, the plurality of first line-shaped mask patterns extending in a first direction;

forming a plurality of second line-shaped mask patterns over the plurality of first line-shaped mask patterns, the plurality of second line-shaped mask patterns extending in a second direction different from the first direction;

removing first portions, which are not overlapped with the plurality of second line-shaped mask patterns, from the plurality of first line-shaped mask patterns in the memory cell region to leave a plurality of island-shaped mask patterns above the memory cell region;

removing second portions, which are overlapped with the plurality of second line-shaped mask patterns, from the plurality of first line-shaped mask patterns in the array edge region to leave a holes-provided mask pattern above the array edge region;

forming a mask pattern which includes a plurality of holes provided on portions, which are not overlapped with the plurality of second line-shaped mask patterns, of the plurality of first line-shaped mask patterns above the array edge region; and forming, with the mask pattern which includes the plurality of holes, a plurality of contact holes in the array edge region to provide a plurality of contact electrodes connected to a plurality of word-lines.

2. The method of claim 1, wherein a height position of a bottom of recesses in the memory cell region and a height position of each upper surface of the plurality of word-lines in the array edge region are substantially the same.

3. The method of claim 1, wherein the plurality of contact holes have reversed tapered shape.

4. The method of claim 1, wherein the holes are defined as first holes, and wherein the contact electrodes are defined as lower contact electrodes, further comprising:

covering an insulating film over the lower contact electrodes;

etching a plurality of portions of the insulating film to make second holes exposing the upper surface of the lower contact electrodes;

filling the second holes with second conducive material;

etching-back the second conductive material to leave it in the second holes acting as an upper contact electrode.

5. The method of claim 4, wherein a size of the upper surface of the lower contact electrode is bigger than a size of the lower surface thereof.

6. The method of claim 4, wherein a size of the upper surface of the lower contact electrode is bigger than a size of the lower surface of the upper contact electrode.

7. An apparatus comprising:
a substrate;
a memory cell region over the substrate;
an array edge region over the substrate, and the array edge region being adjacent to the memory cell region;
a plurality of word-lines extending in parallel across the memory cell region and the array edge region; and
a plurality of word-line contacts provided on the word-lines in the array edge region;
wherein the plurality of word-line contacts include a plurality of lower contact electrodes disposed on upper surfaces of the word-lines respectively and a plurality of upper contact electrodes connected to upper surfaces of the lower contact electrodes respectively; and
wherein a size of an upper surface of each of the plurality of lower contact electrodes is bigger than a size of a lower surface of each of the plurality of lower contact electrodes.

8. The apparatus of claim 7, further comprising a plurality of bit-line contacts connected to a surface of an active region of the memory cell region,
a height position of each upper surface of the plurality of word-lines and a height position of each lower surface of the plurality of bit-line contacts are substantially the same.

9. The apparatus of claim 7, further comprising a plurality of bit-line contacts connected to an active region of the memory cell region,
a height position of each lower surface of the lower contact electrodes and a height position of each lower surface of the plurality of bit-line contacts are substantially the same.

10. The apparatus of claim 7, wherein the size of the upper surface of the lower contact electrodes is bigger than the size of the lower surface thereof.

11. The apparatus of claim 10, wherein the size of the upper surface of the lower contact electrodes is bigger than the size of the lower surface of the upper contact electrodes.

* * * * *